Figure 1:
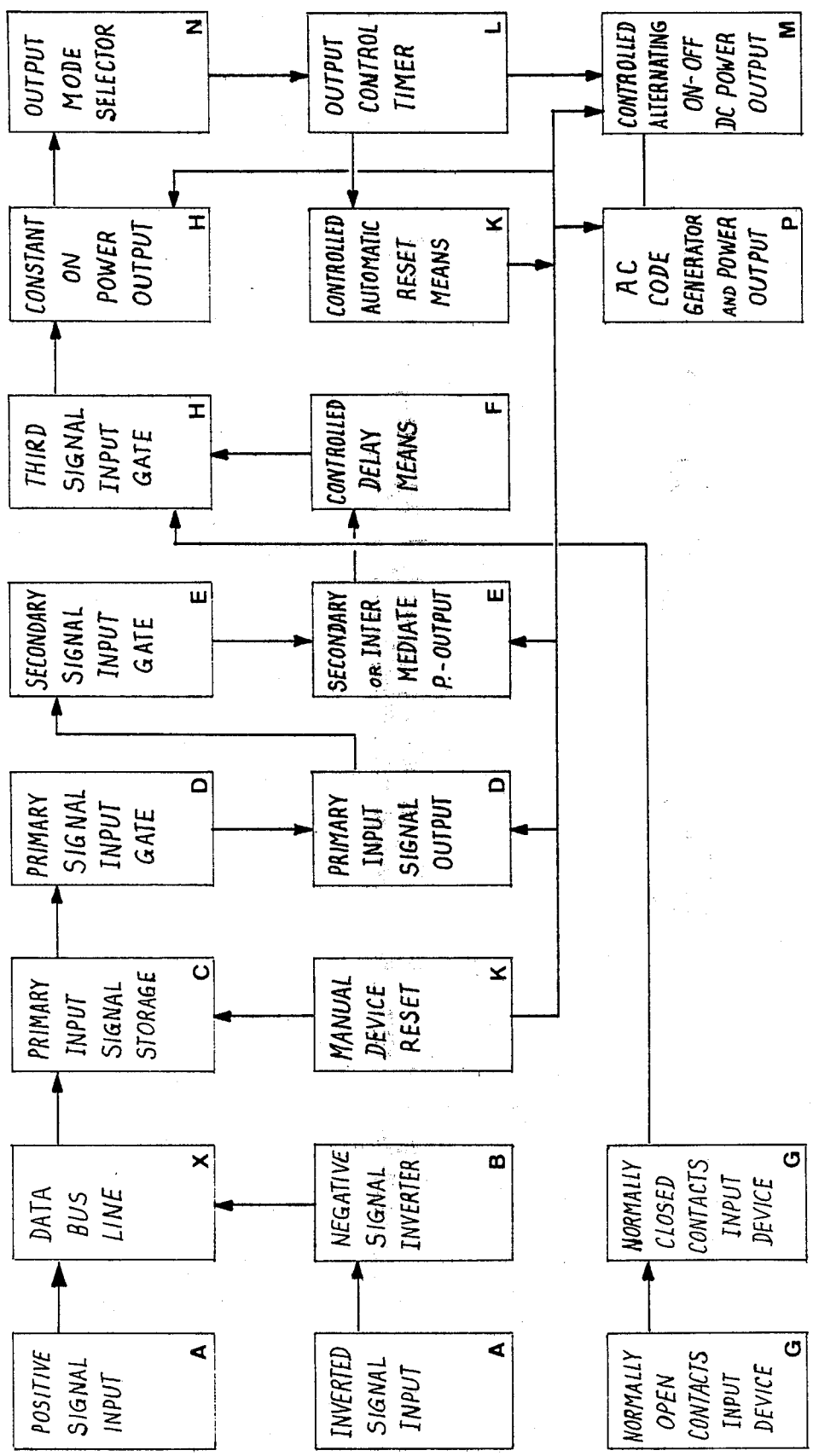

United States Patent [19]

Schulz

[11] 4,413,190
[45] Nov. 1, 1983

[54] AUTOMATIC CONTROL DEVICE

[76] Inventor: Friedemann J. Schulz, 11 Richard St., Touraine by Gatineau Pt., Province of Quebec, Canada, J8T 1G3

[21] Appl. No.: 269,267

[22] Filed: Jun. 9, 1981

[51] Int. Cl.³ .......................................... H03K 17/00
[52] U.S. Cl. .............................. 307/241; 307/252 R; 328/73
[58] Field of Search ...................... 328/72, 73, 74, 75; 307/242, 243, 241, 252 R

[56] References Cited

U.S. PATENT DOCUMENTS 3,551,825  12/1970  Du Vivier et al. .................. 328/74
4,009,468   2/1977  Calcagno et al. .................. 307/243
4,234,850  11/1980  Collins ............................... 328/74

Primary Examiner—John S. Heyman

[57] ABSTRACT

This invention relates to automatically or manually activated solid state control devices and, more in particular, to a diode, transistor, thyristor and logic function control apparatus. The device performs input signal translations, control functions, multiple step counting and features additional series, as well as in parallel connected input sensing and processing circuits. All accepted input data is available at corresponding power output terminals which are, furthermore, joined to direct or delayed acting control circuits of a multi-function controlled power output stage. The output functions comprise a constant control power output, a timed and alternating on-off controlled power output, an automatic or manually controllable device reset and a number of tone generators, including an AC power output stage. The device is designed to serve in industry and homes for control and security purposes, where its versatility, small size and extremely low power consumption on standby makes it especially attractive.

9 Claims, 2 Drawing Figures

AUTOMATIC CONTROL DEVICE

At the present time, a number of control apparatus and systems have been developed to serve a large number of input devices or to perform a host of different control functions in industry and homes. Most of the devices are of mechanical nature or are only intended to be used for particular applications. In addition, the periodic maintenance and recalibration procedures limit their use for applications in remote installations. Another problem of most systems is the excessive weight, size and current consumption which is associated with the use of inductive devices such as power relays and electromechanical switches. A further problem is the sensitivity to vibrations and the limited environment in which such systems will work reliably. A number of thyristor switches has emerged during the past years, but their uses are limited to specific applications.

The Automatic Control Device is the product of two independently started developments, namely a miniature very low current anti-theft device for cars, freezer defrost indicator, flood alarm, fire alarm, etc., and a reliable reactor peripheral control apparatus with a number of different control power output modes including remote signaling and automatic reset means.

It is because of the combination of these special functions that the circuit I developed is difficult to compare with other patented control circuits such as the ones disclosed in the U.S. Pat. Nos. 3,551,825, 4,009,468 and 4,234,850.

The U.S. Pat. No. 3,551,825 discloses a phase shift cycle generator for traffic control systems, that operates on the principle of a primary generated base frequency and a secondary derived frequency. The resultant frequency shift, after comparison with the primary frequency supplies, the system's output signal to control other output circuits. The present invention does not require a cycle generator for its operation, nor does it need to have additional circuitry or devices to deliver the described output power. Some timing devices are employed in the ACD control signal circuits, the subroutine circuits, the automatic resetting and tone generation circuits.

The U.S. Pat. No. 4,009,468 depicts a matrix type input data concentrator or processor. This type of logic circuitry is frequently used for signal coding and decoding such as needed in calculators or similar devices employing matrix selection networks. In this particular invention, the designers constructed the circuit in modular form in order to provide room for expansion or for flexibility in their design. The modular design techniques in the construction of electronic circuitry are known and practiced for some time. The preceeding invention and the ACD are designed in modular fashion, but contain considerably different modules. Although the present invention features modular circuit design techniques, its function, the movement of data, construction and output capability are distinctly different.

Another U.S. Pat. No. 4,234,850, entitled adaptive firing time control circuit, comprises a performance optimizing system for producing a controlled delay between a first event and the time at which a response to that event is to take place or, more in particular, the circuit is designed to compare an input signal to the systems operating parameters and advance, or retard, the output signal accordingly. The system was primarily designed to replace the mechanical or vacuum advance firing system in automobile ignition systems, but may also prove to be of excellent use where the synchronization of an output action to a predetermined norm is required.

Again, the present invention varies distinctively from the prior cited art, as it does not employ comparison circuitry, nor can it be made to continuously track and readjust its output to a preset norm. The Automatic Control Device is designed and built to accept and transform very low input signals from various input devices into a number of different output modes, such as pulses or voltage levels, to operate heaters, motors, relays, transformers and various audio power output devices as a result of a direct or selectively delayed response to an input action. At the end of a preselected time and number of events in the power output circuits, an automatic device resetting can be initiated. Unlike most selective control systems, the present invention provides a positive power output for each negative or positive input pulse or potential applied and remains energized until manual or automatic resetting is initiated.

SPECIAL ADVANTAGES OF THE PRESENT DEVICE OVER EXISTING SYSTEMS

The present invention provides an improvement over the prior art in that a combination of logic, analog and electronic switching functions are employed to eliminate the problems of previous devices such as contact bounce, oxidation of contact areas, mechanical instability, high power consumption and the need for periodic maintenance which is limiting their reliable operation in remote or isolated areas.

The all solid state PCB construction provides a rugged reliable and maintenance free control apparatus for industry and homes.

Fail-safe operation is guaranteed by a 12 V, rechargeable supply.

Positive and negative, single or multi-trigger input terminals, as well as series and parallel connected input circuits, provide a wide variety of input conditions.

A constant control power output provides a continuous supply of DC power until reset occurs.

Alternating on-off control power output of variable pulse length and a controllable automatic circuit reset at the end of a selected power output cycle is another device function. An audio power output for a number of code generators and medium power outputs for each generated input pulse are additional features of the control device.

The device is a perfect interface and converts logic levels as well as analog levels into power outputs.

A special heat sink allows this unit to operate safely.

The power output delay timer is externally adjustable and has a delay range of up to 60 seconds.

The unit is very small and, therefore, can easily be hidden.

Additional subroutine circuits can be interfaced to expand the counting and reset range of the unit.

It is the object of this invention to provide an improved, reliable and versatile electronic control system that is operable from a 12 V DC, rechargeable power supply, operating on one or any combination of the four input terminals and to provide in response to each input function one or more power output responses.

The above object is accomplished by providing an apparatus for producing delayed or not delayed, constant, variable, timed and continuously alternating on-off controlled power outputs, including means for manual or selective automatic circuit resetting and having at least four input terminals of which two are complementary and responsive to either positive or negative going DC levels or pulses which require at least one additional DC input level or pulse to produce a control power output, while the other input terminals are directly responsive to an input action and are connected into series and parallel input circuit arrangements.

The description of the preferred embodiment is set forth in conjunction with the following drawings:

FIG. 1—a block diagram of the control device, and

Figure 2:
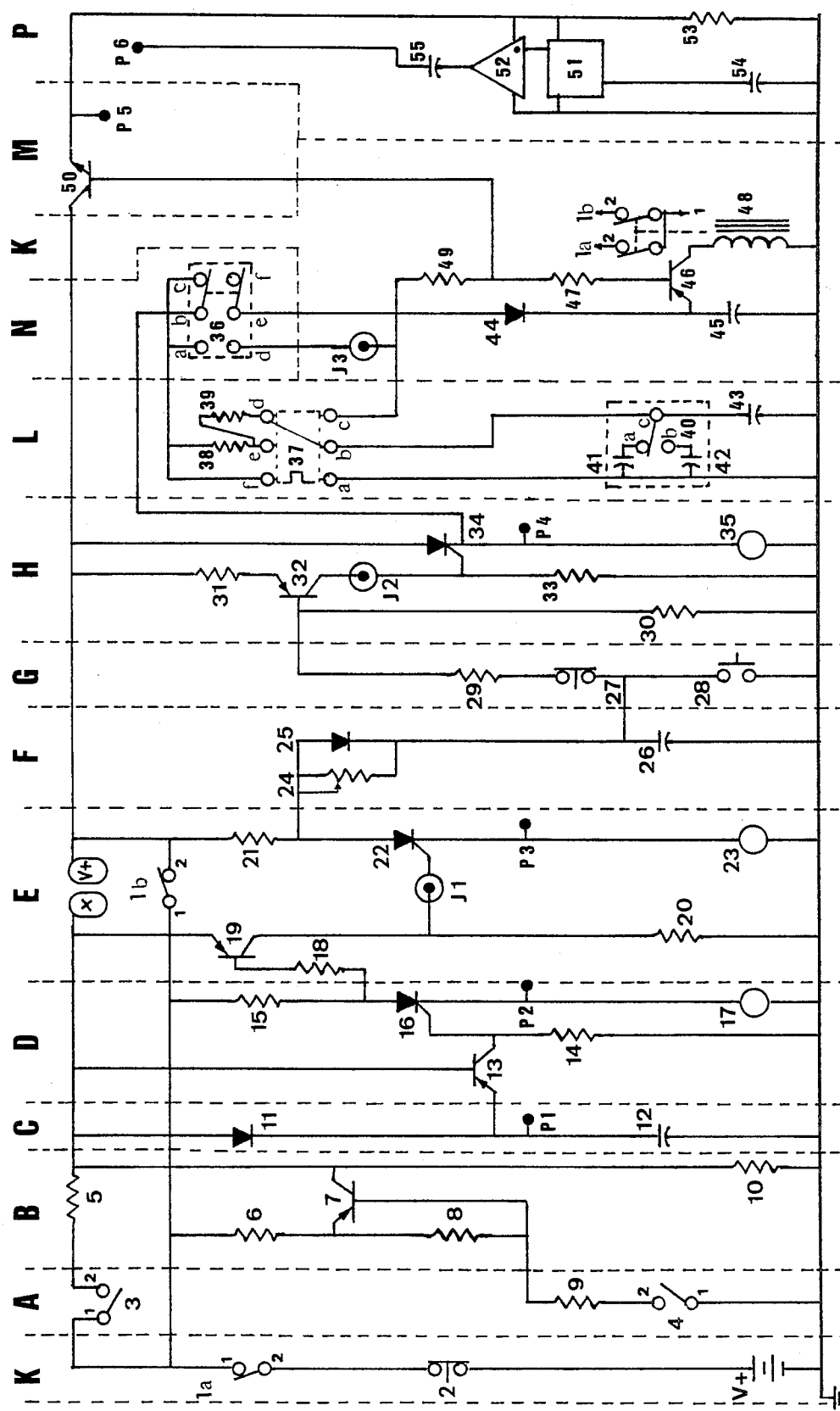

FIG. 2—a schematic diagram of the basic circuitry (including an interconnected subroutine circuit).

CIRCUIT DISCLOSURE

The Automatic Control Device, named ACD, comprises a selective and programmable solid state circuit. It converts various types of input signals, direct or delayed, into DC and AC power outputs. The primary signal processing circuits and the automatic resetting circuit of the device are programable and expandable by the interconnection of a number of subroutine circuit units. The ACD may be activated or resetted by manual (switch) or automatic (circuit) means and incorporates means for the automatic resetting of the device at the end of a selected number of operations. Full or partial automated device resetting is determined by the physical position of the reset circuits output devices in the main power line V+.

FIG. 1 of the specification is a flow chart of the ACD and shows the functional blocks of the device with their general interconnections. The blocks are identified by reference letters identical to those enclosed in the dashed lines of the functional blocks of the circuit schematic FIG. 2 of the specification.

The reference letters of FIGS. 1 and 2 will be used throughout the disclosure and this will eliminate any further reference to FIG. 1, except for the disclosure of the contents contained in the various blocks.

The circuit of the ACD will be divided into four (4) main parts:
 1. Part I deals with data acquisition, transfer, delay and the power outputs provided by the intermediate stages of the basic input processing circuits.
 2. Part II deals with the generation and output of three high current DC and AC power output modes.
 3. Part III is the disclosure of the programable automatic device resetting circuit.
 4. Part IV presents a detailed description of a basic and expanded subroutine circuit.

Part I

Data acquisition, transfer, delay and intermediate power outputs within the basic input processing circuits.

Normally open switches #3 and #4, in block A of FIG. 2, or an electronic circuit having high input impedance, are used to provide the input signal for the passive storage circuit of block C. The application of a positive (Vc) or negative (ground) potential or pulse at #3-2 or #4-2, in block A, ensures a positive control signal on the control signal data bus line, identified by an X in FIG. 2. The components #6, 7, 8 and 9, in block B, comprise the negative input signal inverter. Resistor 10 doubles as the load for the inverter and also as a bleeder for the control signal data bus. Resistors 5 and 9, in block B, are input current limiters. The application of a positive input potential or signal at #3-2, in block A, results in a positive signal voltage on line X. This potential or pulse is simultaneously applied to the passive storage circuit 11 and 12 of block C and also to all connected subroutine circuit gates, such as the two contained in blocks D and E of FIG. 2. As capacitor 12 is charged up through blocking diode 11 to V+, gate 13 of block D is held by reverse bias at cut-off and does not conduct. The same condition applies to the second subroutine circuit gate 19, in block E. Only upon removal of the applied input signal or pulse from line X and the subsequent return of line X to ground potential, will the first gate 13 transfer the positive charge from storage capacitor 12 to the gate of the silicon controlled rectifier 16 (called SCR) and trigger the device into conduction. This results in a power output at point P-2 across load 17. Simultaneously, a voltage drop occurs at the anode of SCR 16 providing a foreward bias for the second subroutine circuit gate 19 in block E. When another positive signal enters line X, gate 19 is ready for conduction and transfers the applied input potential through J-1, a normally shorted input jack and the interconnection point for additional subroutine circuit units, to the gate of SCR 22 to trigger this device into conduction. While power output is obtained at P-3 and applied across the load 23, the anode voltage is reduced from V+ to a selected value. Blocks C, D and E constitute the building blocks of a basic subroutine circuit unit. Block E also contains one example of other locations where the output resetting device 48-1-b (in this example relay contacts) may be located to perform partial resetting of the ACD.

The lowered potential at the anode of SCR 22 and load resistor 21, in block E, causes a controlled discharge of timing capacitor 26 through control resistor 24 of block F. Diode 25 provides a quick charge-up of #26 at the initial start up or after reset of the ACD. Block G contains two additional direct acting input devices, or switches. Whereas #27 represents normally closed input device contacts, #28 is the complement and has normally open device contacts. Upon activation of these input devices, immediate DC and AC power ouputs result. The now depleted high potential of capacitor 26, in block F, connects through the series input circuit device into the third primary input gate and enables the device to conduct and produce a control current. This output connects, through J-2, a normally shorted input jack provided for interconnection of timed subroutine circuit unit, to the gate of SCR 3 and triggers this SCR into conduction. The load #35, connected across the power output terminal P-4 and ground, ensures the thyristor's operation independently of external load conditions.

Part II

Generation and operation of high current DC and AC controlled power output.

The application of a trigger potential, derived from the output of #32, in block H, is applied to the gate of SCR 34 and triggers the device into conduction. This produces a power output at its cathode, load 35 and also at the power output terminal P-4. P-4 will remain energized until automated or manual device resetting is initiated. This power output terminal also provides the regulated input power to the output mode selector switch 36, in block N, a DPDT, CT-off type. The switch controls the selection of three power output modes, including the automatic or manual resetting of the ACD.

In Output mode 1 (centre-off position) of the output mode selector 36, the power output terminal P-4 is only connected to terminal 36-b and, therefore, generates no other power outputs.

Output mode 2 is the indicated position of #36 in FIG. 2. P-4 connects again the terminal 36-b, but also connects the applied input potential via 36-c to the power supply input terminal of 37-f, block L. This is the generator of a variable control signal output, which produces a timed control signal voltage at terminal 37-c. The duration of the control signal output depends on the setting of the timing selector switch 40 and the value of capacitors 41, 42 and 43, while its duty cycle depends upon the value of the resistors 38 and 39.

The positive control signal output obtained from terminal 37-c connects through the current limiter 49 to the base of the power output device 50, in block M, to control the output power of the alternating on-off power output stage. It also passes through the normally shorting input connector J-4 to terminal 36-d of block N and through current limiter 47, block K, to the base of the automatic reset circuit control gate 46. In the present position of output mode selector 36 b-c and e-f, the automatic reset circuitry is not connected and, therefore, only a constant DC and an alternating on-off controlled DC power output at P-5 and an AC power output at P-6 are generated.

Part III

Programmable automatic device resetting.

To perform automatic device resetting, output mode selector switch 36 must be in position 3, where it connects terminals 36-a to b and d to e. As explained earlier, regulated input voltage derived from P-4 connects via terminals 36-a and b to the power input terminal f of the output control timer 37, where it produces an output control signal pulse at 37-c. This output pulse connects through the normally shorting input connector J-3, in block K, to the output mode selector switch 36-d from where it connects internally to terminal 36-e and than through diode 44 to the input storage device capacitor 45 of the automatic resetting control gate 46. The output pulse of 37-c connects also through current limiter 49 and 47 to the base of the reset circuit control device 46. This results in a reverse biasing of the reset control device and results in its cut-off state. When the positive output cycle of the output control timer 37-c is completed, its output potential at terminal 37-c drops to zero. The resulting absence of the positive control signal at the base of #50 stops the current flow through the device. This results in a loss of DC power output at terminal P-5 and its dependent AC power output circuit at terminal P-6. At the same time, as the output potential of the output control timer 37-c becomes zero, the automatic resetting circuits control gate becomes enabled and transfers the stored charge from capacitor 45 to its collector where it energizes the output reset circuit, or device 48. Here, the output device 48 controls two normally closed switches 1-a and 1-b, which interrupt the main power supply line in block K or E when the reset circuit is energized. Whereas switch 1-a performs a complete control device resetting, 1-b demonstrates a selective or partial resetting of the ACD (circuit block). If programmed or delayed, automatic circuit resetting becomes necessary, the normally shorted input jack J-3, block K, may be used for a series insertion point of one or more subroutine circuits. Now, the output potential of the output control cycle generator 37-c (J-3 centre) becomes a new input signal line X for additional subroutine circuits. The output of the final subroutine circuit connects again to J-3 at 36-d.

Part IV

Basic subroutine circuit and its interconnections

The basic subroutine circuit disclosed here and employed in the ACD circuitry is essentially a timed and controlled gating device for controlling the output of a number of high power output stages.

A basic subroutine circuit unit consists of a primary input signal storage circuit, block C, an inverted gate circuit with a power output, block D, and a gated secondary input signal processing circuit with a power output, as shown in block E. Input potentials, voltage levels or pulses, are connected to the input signal control data bus line X, while the input power for all subroutine units is drawn from the main power supply line V+, which is selectively controlled by manual or automatic circuit resetting means.

A selectively delayed circuit resetting of the ACD is accomplished by the insertion of subroutine circuit units at J-3. Here, the input of the subroutine unit gets energized by the output signal of the output control timer 37-c at J-3, while the output potential of the last subroutine circuit unit connects to the signal input connector J-3 at the output mode selector switch 36-d, from where terminal 36-e connects this output signal through diode 44 to the control output signal storage capacitor 45 and than to the input terminal of the reset control gate 46. Terminal 37-c of the output control timer would now become equivalent to the input data bus line X.

If a plurality of input or output operations with different time intervals in between succeeding output functions is required, the controlled time delay, block F, and the following power output gate, block H, should be added and connected to the basic subroutine unit, as shown in FIG. 2. The new subroutine circuit would now consist of blocks C, D, E, F and H, where power thyristor 34 may be replaced by a medium power output device. The output from the cathode of this output device, at P-4, would now provide the input signal for additional subroutine circuit units in the primary input processing circuits or for the automatic circuit resetting gate 46.

The embodiments of the invention in which an exclusive property or privilege is claimed are defined as follows:

1. A programmable control device for producing control power outputs in response to primary, secondary, delayed or directly applied input signals, and including programmable circuit means for resetting the control device, and comprising further means for controlling a number of intermediate power outputs in response to applied secondary input signals, whereas said means for controlling determine also a number of final power output repetitions before resetting of said control device is initiated and whereas said means for controlling comprises a basic subroutine circuit unit connected to an input data bus line and joined to a gated input signal storage circuit that is connected to a first inverted input gate circuit, whose output is joined to the input control gate of a first intermediate power output silicon controlled rectifier (SCR) and whereas the output of this device connects to the input of a secondary control gate, that responds only to repeatedly applied signal inputs to said input data bus line and whereas the output of said secondary control gate connects to the control gate of a second intermediate power output SCR, to trigger this device into conduction and comprising means whereas the output of said second intermediate power output SCR is joined to final means for extending said basic subroutine circuit units function by connecting a rapid charge-up timing circuit to the anode of said second intermediate power output SCR for selectively delaying and applying said second intermediate power output potential to a third inverted input gating circuit, whose output is joined to the gate of a succeeding constantly on control power output SCR to trigger this device into conduction while comprising additional means to connect said constantly on control power output to power output connectors and input connections of an output mode selector, whose output functions comprises means for activating selectively a primary output control timer, a selective automatic control device reset circuit, an output cycle repetition extention circuit and final DC and AC control power outputs.

2. The device of claim 1 wherein said control power outputs comprise intermediate power output a constantly on control power output and final DC and AC control power outputs.

3. The device of claim 2 wherein intermediate power outputs are generated upon application of primary or secondary signal inputs to said input data bus line.

4. The device of claim 2 whereas said constantly on control power output is the result of an application of a selectively delayed and gated intermediate power output signal to the input gate of said control power output SCR.

5. The device of claim 2 whereas said final DC and AC control power outputs are generated as a result of a connection of said constantly on control power output to said output mode selector and a subsequent a connection to said primary output control timer whose positive output potential triggers a final DC control power output device into conduction and whose ground potential cuts-off said final DC control power output device and also its dependent AC power output generator.

6. The device of claim 1 wherein said primary or secondary, delayed or directly applied input signals comprise a single or a repeated application of input signals to said input data bus line and whereas a single or a repeatedly applied positive potential (or inverted ground potential) is used to generate an intermediate power output and comprising further means to produce instant control power outputs in direct response to an open or closed circuit, or a switch condition resembling this state.

7. The device of claim 1 whereas a basic subroutine circuit unit connected with its input (said input data bus line) to the output terminal of said primary output control timer, and with its output (gate output of second or third intermediate subroutine circuit) joined to the reset circuits input control terminal of said output mode selector, provides control power output repetition extensions.

8. The device of claim 1 wherein said selective automatic control device reset circuit comprises said primary output control timer whose output is joined to said output mode selector and connected to said gated input signal storage circuit that is connected to said inverted input gate circuit whose output controls an output device for resetting the control device.

9. The device of claim 8 wherein said output device for resetting interrupts a primary power supply line of said control device and whereas the input terminal of said output device for resetting connects to said primary power supply line, the output terminal connects to a secondary power supply line for selectively disconnecting all functional circuit blocks connected to said secondary power supply line.

* * * * *